United States Patent [19]

Messerschmitt

[11] 4,040,049
[45] Aug. 2, 1977

[54] TANDEM BLOCK DIGITAL PROCESSOR FOR USE WITH NONUNIFORMLY ENCODED DIGITAL DATA

[75] Inventor: David Gavin Messerschmitt, Middletown, N.J.

[73] Assignee: Bell Telephone Laboratories, Incorporated, Murray Hill, N.J.

[21] Appl. No.: 621,130

[22] Filed: Oct. 9, 1975

[51] Int. Cl.² ............................................. H03K 13/24
[52] U.S. Cl. ........................ 340/347 DD; 179/15 AV
[58] Field of Search ........... 179/15 AV; 340/347 DD

[56] References Cited

U.S. PATENT DOCUMENTS

| | | | |
|---|---|---|---|
| 3,755,808 | 8/1973 | Candiani | 340/347 DD |
| 3,766,546 | 10/1973 | Aaron et al. | 340/347 DD |
| 3,778,605 | 12/1973 | Montgomery | 340/347 DD X |
| 3,789,392 | 1/1974 | Candiani | 340/347 DD |
| 3,798,635 | 3/1974 | Candiani | 340/347 DD |
| 3,821,711 | 6/1974 | Elam et al. | 340/347 DD X |
| 3,825,924 | 7/1974 | Montgomery | 340/347 DD |
| 3,945,002 | 3/1976 | Duttweiler et al. | 340/347 DD |

OTHER PUBLICATIONS

Croll et al, "Nearly Instantaneous Digital Compandor –," Electronics Letters, vol. 9, No. 14, July 1973, pp. 298–300.
Croisier, "Progress in PCM and Delta Modulation: Block Companded–," International Zurich Seminar on Digital Communicatons, Mar. 1974, 4 pp.

Primary Examiner—Thomas J. Sloyan
Attorney, Agent, or Firm—Richard J. Roddy

[57] ABSTRACT

In a PCM system, character compression using nearly instantaneous companding (NIC) is known to obtain a reduction in the number of bits transmitted. Unfortunately, in tandem digital PCM-to-NIC-to-PCM conversions, a signal delay results because a maximum segment value is usually unknown until a block of PCM characters, which are to be converted to make up a block of NIC characters, has been received. Further, if the PCM block is received out-of-phase, a signal degradation may result because the incorrect maximum sgement value may be used during a subsequent conversion. To mitigate delay, the disclosed processor discards certain least significant bits of a PCM character and substitutes therefor a predetermined bit pattern corresponding to the difference between the maximum segment value and the segment value of the first character of the block. To mitigate degradation, the processor adjusts the block phase upon detection of the absence of a predetermined difference between the maximum segment value and the segment value of another character in the block.

12 Claims, 7 Drawing Figures

FIG. 4
8-TO-6-TO-8 BIT CODE TRANSLATION TABLE

| MAXIMUM SEGMENT | INPUT 8-BIT CHARACTER | NIC 6-BIT CHARACTER | PRIOR ART RECONSTRUCTED 8-BIT CHARACTER | IMPROVED RECONSTRUCTED 8-BIT CHARACTER |
|---|---|---|---|---|
| 111 | S111WXYZ | S1WXYZ | S111WXYZ | S111WXY1 |
| 111 | S110WXYZ | S01WXY | S110WXY1 | S110WX10 |
| 111 | S101WXYZ | S001WX | S101WX10 | S101W100 |
| 111 | S100WXYZ | S0001W | S100W100 | S1001000 |
| 111 | S011WXYZ | S00001 | S0111000 | S0110000 |
| 111 | S010WXYZ | S00000 | S0100000 | S0110000 |
| 111 | S001WXYZ | S00000 | S0100000 | S0110000 |
| 111 | S000WXYZ | S00000 | S0100000 | S0110000 |
| 110 | S110WXYZ | S1WXYZ | S110WXYZ | S110WXY1 |
| 110 | S101WXYZ | S01WXY | S101WXY1 | S101WX10 |
| 110 | S100WXYZ | S001WX | S100WX10 | S100W100 |
| 110 | S011WXYZ | S0001W | S011W100 | S0111000 |
| 110 | S010WXYZ | S00001 | S0101000 | S0100000 |
| 110 | S001WXYZ | S00000 | S0010000 | S0100000 |
| 110 | S000WXYZ | S00000 | S0010000 | S0100000 |
| 101 | S101WXYZ | S1WXYZ | S101WXYZ | S101WXY1 |
| 101 | S100WXYZ | S01WXY | S100WXY1 | S100WX10 |
| 101 | S011WXYZ | S001WX | S011WX10 | S011W100 |
| 101 | S010WXYZ | S0001W | S010W100 | S0101000 |
| 101 | S001WXYZ | S00001 | S0011000 | S0010000 |
| 101 | S000WXYZ | S00000 | S0001000 | S0010000 |
| 100 | S100WXYZ | S1WXYZ | S100WXYZ | S100WXY1 |
| 100 | S011WXYZ | S01WXY | S011WXY1 | S011WX10 |
| 100 | S010WXYZ | S001WX | S010WX10 | S010W100 |
| 100 | S001WXYZ | S0001W | S001W100 | S0011000 |
| 100 | S000WXYZ | S0000W | S000W100 | S0001000 |
| 011 | S011WXYZ | S1WXYZ | S011WXYZ | S011WXY1 |
| 011 | S010WXYZ | S01WXY | S010WXY1 | S010WX10 |
| 011 | S001WXYZ | S001WX | S001WX10 | S001W100 |
| 011 | S000WXYZ | S000WX | S000WX10 | S000W100 |
| 010 | S010WXYZ | S1WXYZ | S010WXYZ | S010WXY1 |
| 010 | S001WXYZ | S01WXY | S001WXY1 | S001WX10 |
| 010 | S000WXYZ | S00WXY | S000WXY1 | S000WX10 |
| 001 | S001WXYZ | S1WXYZ | S001WXYZ | S001WXY1 |
| 001 | S000WXYZ | S0WXYZ | S000WXYZ | S000WXY1 |
| 000 | S000WXYZ | S0WXYZ | S000WXYZ | S000WXY1 |

FIG. 5

| CHARACTER NUMBER | ORIGINAL PCM-TO-NIC COMPRESSION | | SUBSEQUENT PCM-TO-NIC COMPRESSIONS | | | | CHARACTER NUMBER |
|---|---|---|---|---|---|---|---|
| | | | CORRECT BLOCK PHASE | | INCORRECT BLOCK PHASE | | |
| | | | PRIOR ART | | PRIOR ART | | |
| | ORIGINAL PCM CHARACTER | ORIGINAL NIC CHARACTER | RECONSTRUCTED 8-BIT CHARACTER | NIC CHARACTER | RECONSTRUCTED 8-BIT CHARACTER | NIC CHARACTER | |
| 1 | S000WXYZ | S000000 | S0010000 | S000000 | S0100000 | S000000 | 1 |
| 2 | S000WXYZ | S000000 | S0010000 | S000000 | S0100000 | S000000 | 2 |
| 3 | S001WXYZ | S000000 | S0010000 | S000000 | S0100000 | S000000 | 3 |
| 4 | S010WXYZ | S00001 | S0101000 | S00001 | S0100000 | S000000 | 4 |
| 5 | S011WXYZ | S0001W | S011W100 | S0001W | S0111000 | S00001 | 5 |
| 6 | S100WXYZ | S001WX | S100WX10 | S001WX | S100W100 | S0001W | 6 |
| 7 | S101WXYZ | S01WXY | S101WXY1 | S01WXY | S101WX10 | S001WX | 7 |
| 8 | S110WXYZ | S1WXYZ | S110WXYZ | S1WXYZ | S110WXY1 | S01WXY | 8 |
| 9 | S111WXYZ | S1WXYZ | S111WXYZ | S1WXYZ | S111WXYZ | S1WXYZ | 9 |

TANDEM BLOCK DIGITAL PROCESSOR FOR USE WITH NONUNIFORMLY ENCODED DIGITAL DATA

BACKGROUND OF THE INVENTION

1. Field of the Invention

This invention relates to a bit rate reduction and, more particularly, to data compression and expansion methods and apparatus for processing digital characters.

2. Description of the Prior Art

In a pulse code modulation (PCM) system, a typical analog-to-digital encoder functions to quantize an analog sample and to generate a digital character. In nonuniform PCM encoding, for example, encoding according to a $\mu = 255$ companding law such as is utilized in the D2 and D3 channel banks of the Bell System, each analog sample is converted into an eight-bit digital character. The initial bit of the digital character represents the sign or polarity of the analog sample while the coarse amplitude of the analog sample is represented by the three bits following the sign bit. Each value of these three bits, knows as a segment or chord value, represents one of eight amplitude ranges. The value of consecutive segments corresponds to a doubling in magnitude of the analog sample. Finally, the remaining four digital bits, called the mantissa bits, represent one of sixteen usually equal length intervals present in each one of the segments or chords.

In copending application D. L. Duttweiler-D. G. Messerschmitt, Ser. No. 517,879, filed Oct. 25, 1974, a digital block processor is disclosed for compressing a predetermined number of nonuniformly encoded PCM digital characters, called a PCM block. The PCM block is stored in a digital delay while the maximum segment value present in the block is determined. The three-bit maximum value is then transmitted to a receiving station. Thereafter, character-by-character, each PCM character in the block is advantageously coded to produce a character having fewer bits, called a Nearly Instantaneous Companded (NIC) digital character. The plurality of NIC characters is called a NIC block. Each illustrative NIC character in a NIC block consists of six bits. The initial bit is the same as the sign bit as in the PCM character. The second bit is determined as follows: (1) If the PCM character has a segment value equal to the maximum segment value and the maximum value is not 000, the three bits representing the segment value are simply replaced by a logic one so that the second bit in the NIC character becomes a logic one, or (2) if either the PCM character has a segment value not equal to the maximum segment value or the maximum segment value is 000, the second bit in the NIC character becomes a logic zero. The remaining four bits in the NIC character are obtained responsive to the following shift operation. The mantissa bits for a stored PCM character are placed in a shift register. The register is thereafter right shifted by an amount which is dependent on the difference between the maximum segment value and the segment value represented by the segment bits of the stored PCM character. The resultant 6-bit NIC character is then transmitted to the receiving station. At the receiving station, the maximum segment value and the NIC character are utilized to expand the NIC character so as to reconstruct a PCM character similar to the compressed PCM character. Of course, futher compression, expansion, compression, expansion et cetera is possible and is herein called tandem PCM-to-NIC-to-PCM processing.

In the prior art illustrative embodiment, eight 8-bit digital characters are assumed to be present in each PCM block. Accordingly, it is clear that without data compression a PCM block of 64 bits would be transmitted to the receiving station. In contradistinction, when the prior art 6-bit NIC data compression arrangement is employed, a NIC block plus maximum segment value of only 51 bits is transmitted, a decided reduction in bit rate and concomitant reduction in bandwidth, albeit not without some signal degradation.

Unfortunately, in tandem PCM-to-NIC-to-PCM processing, if the PCM block phase used upon a subsequent PCM-to-NIC compression is different than that used with its original PCM-to-NIC compression, still further signal degradation may be obtained. This unfortuitous result obtains because the incorrect maximum segment value may be used during the subsequent compression.

Accordingly, a broad object of my invention is to provide improved data compression and expansion methods and apparatus for mitigating signal degradation in tandem digital processing.

Further in tandem processing, a signal delay accumulation problem may arise. Specifically, this problem arises in known prior art arrangements because the maximum segment value is unknown until the plurality of PCM characters which are to be compressed to make up the NIC block have been received.

Accordingly, another broad object of my invention is to provide improved data compression and expansion methods and apparatus for mitigating signal delay.

SUMMARY OF THE INVENTION

These and other objects are achieved in accordance with the principles of my invention, one aspect of which includes discarding at least one predetermined bit of a predetermined compressed digital character of a block. Then, during a subsequent data expansion, for example during a NIC-to-PCM expansion, a bit is substituted therefor to obtain a reconstructed character corresponding to the compressed character, the substitution being made in accord with a predetermined translation arrangement. Advantageously, in a still subsequent data compression, for example in a PCM-to-NIC compression, the maximum segment value of the block can be determined from the thus reconstructed character through an inverse translation arrangement. For example, the maximum segment value equals the segment value of the reconstructed character, except when that value is 000, plus the number of least significant logic zeros preceding the first logic one in the least significant mantissa bits of the reconstructed character. Thereby, signal delay accumulation is substantially mitigated.

Further, in accordance with another aspect of my invention, the occurrence of a predetermined difference is detected between the maximum segment value determined from the reconstructed character and the segment value of another character in the reconstructed block. Responsive to the detected difference, the block phase can be adjusted, for example advanced or retarded, a predetermined number of characters until an absence of the predetermined difference is detected. Thereby, the block phase is speedily restored and signal degradation is mitigated.

BRIEF DESCRIPTION OF THE DRAWING

My invention should become more apparent from the following detailed description when taken in conjunction with the drawing, in which.

DETAILED DESCRIPTION

Figure 4:
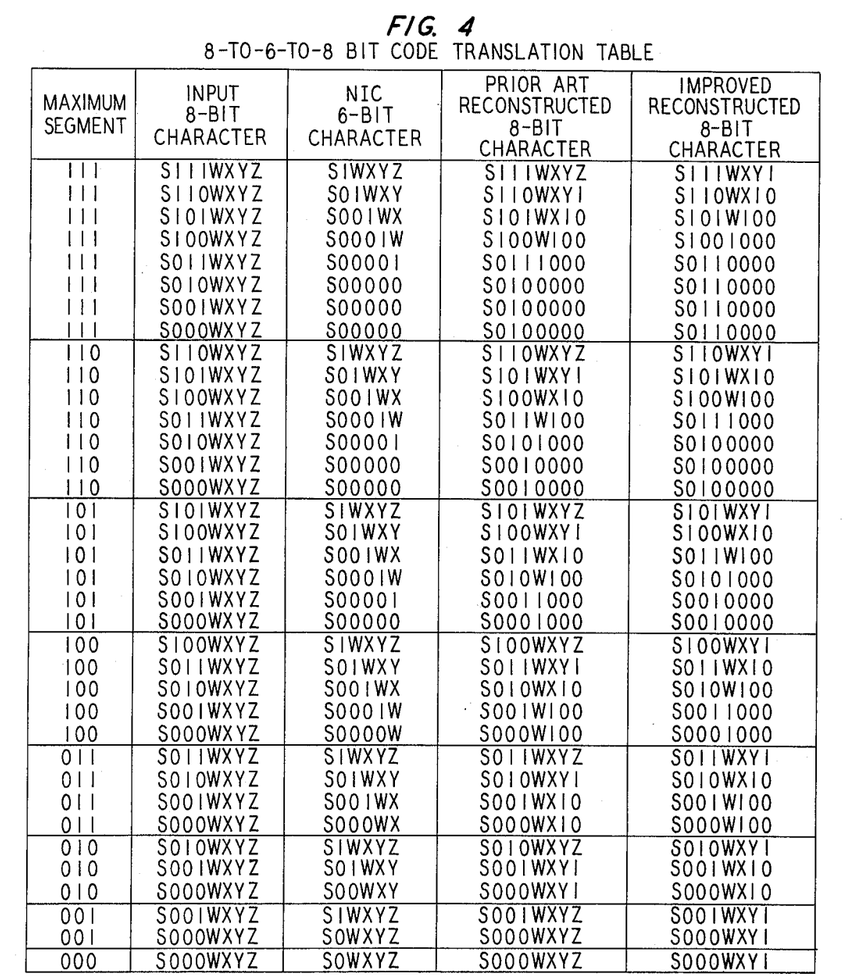
FIG. 4 is an 8-to-6-to-8 bit code translation table useful in explaining one aspect of my invention.

A method utilized by my invention for compressing and expanding data in the tandem processing of digital characters is illustrated by use of FIG. 4. The columns labeled "maximum segment", "input 8-bit character", "NIC 6-bit character" and "prior art reconstructed 8-bit character" correspond to parallel columns in FIG. 4 of the aforementioned D. L. Duttweiler et al application. These columns as employed in the prior art are briefly reviewed here.

Firstly, the input block of PCM characters, which is stored in the prior art digital delay, is advantageously searched to obtain the maximum segment value. The three-bit maximum segment value is then transmitted to the receiving station. Thereafter, the NIC block is transmitted, with the translation table of FIG. 4 being used to illustrate the correspondence between an input 8-bit character and its compressed counterpart, i.e., the transmitted NIC 6-bit character. The first column is arranged to conveniently partition the rows of the translation table into as many groups as there are possible maximum segment values, here illustratively eight. Each row within a group corresponds to a possible input digital character. The second column, with S indicating the sign bit, the next three bits being the segment bits, and WXYZ indicating the four mantissa bits, illustrates for each possible maximum segment value, all possible input digital characters in a PCM block. Clearly the PCM block does not include a character having a segment value exceeding the maximum segment value in the block. The third column of FIG. 4 illustrates the compressed NIC 6-bit character produced in response to the input character set forth in the second column. The produced NIC character is thereafter transmitted to the receiving station. The method of producing NIC characters repeats for each remaining input character in the PCM block. So much for the prior art PCM-to-NIC translation compressor arrangement.

As to the prior art NIC-to-PCM expander, the fourth column of FIG. 4 illustrates the 8-bit PCM character which is reconstructed at the receiving station. Broadly, the inverse translation, or expander, arrangement for reconstructing the PCM characters includes detecting the maximum segment value. In response thereto, a group of rows in FIG. 4 is selected. Thereafter, each received NIC 6-bit character corresponds to a row within the group. Accordingly each compressed NIC character in column three results in an expanded reconstructed 8-bit character as shown in column four. However, it is noted that the expansion results in a signal degradation as evidenced by the disparity between the second column, i.e. input, and fourth column, i.e. reconstructed, 8-bit characters, that is, the loss of at least one least-significant bit in each of those reconstructed characters having a segment value less than the detected maximum. So much for the prior art expander.

As aforementioned, a signal delay accumulation problem exists in known prior art data compression arrangements. Specifically, the maximum segment value is typically unknown until the plurality of input PCM characters which are to be converted to make the NIC block have been received. As a result thereof, the subsequent transmission of both the maximum segment value and each NIC character is delayed until all the input characters are received. In addition, in the tandem processing of digital characters, the delay at each PCM-to-NIC compression point in a tandem chain unfortunately accumulates, i.e. is normally additive, in the known prior art.

Now turn to the particulars of one aspect of my invention. According to this first aspect, the maximum segment value is readily ascertainable from a predetermined reconstructed digital character of a block, illustratively the first character of a reconstructed PCM block. Thereby, subsequent PCM-to-NIC compressions can be made without delaying until the plurality of PCM digital characters comprising the PCM block have been received. Advantageously, signal delay is thus significantly mitigated.

To illustrate this first aspect, refer to the fifth column of FIG. 4, labeled "improved reconstructed 8-bit character." Broadly, the first improved reconstructed character of the PCM block has appended thereto a predetermined bit pattern. That bit pattern can be utilized during a subsequent compression to determine the maximum segment value of the block. Specifically, yet illustratively, the maximum segment value equals the segment value of the first reconstructed character, except when that value is 000, plus the number of logic zeros preceding the first logic one in the least-significant of the mantissa bits of the first reconstructed character. When that value is 000, it is especially treated as though it were 001. Accordingly, since the first reconstructed character in the PCM block includes information from which a data compressor can obtain the maximum segment value, the delay at each subsequent PCM-to-NIC compression point in a tandem chain can be significantly mitigated.

However, in comparing columns four and five of FIG. 4, it becomes evident that the advantages of this aspect of my invention are obtained at the expense of robbing one bit of the first reconstructed PCM character. The other reconstructed characters in the PCM block can be the same as in the prior art, i.e. as shown in column four. In the illustrative eight character block this bit robbing amounts to one bit out of 64 bits. The bit robbing aspect results therefor in a slight signal degradation as compared to the aforedescribed prior art arrangement. The additional degradation as manifested by a reduction in the signal-to-quantizing noise ratio is about $10 \log [1 + 3/N]$ decibels, where N represents the number of digital characters in a block. Illustratively, for an eight-character block, the signal degradation is about 1.38 dB. Also stemming from the bit robbing is the following fact. During a subsequent compression each improved reconstructed character of column five when applied to a compressor as an input character of column two will result in a NIC character of column three, which NIC character will always have a logic one as its least significant bit. This fact is utilized in hereinafter described apparatus for practicing this first aspect of my invention.

Figure 5:
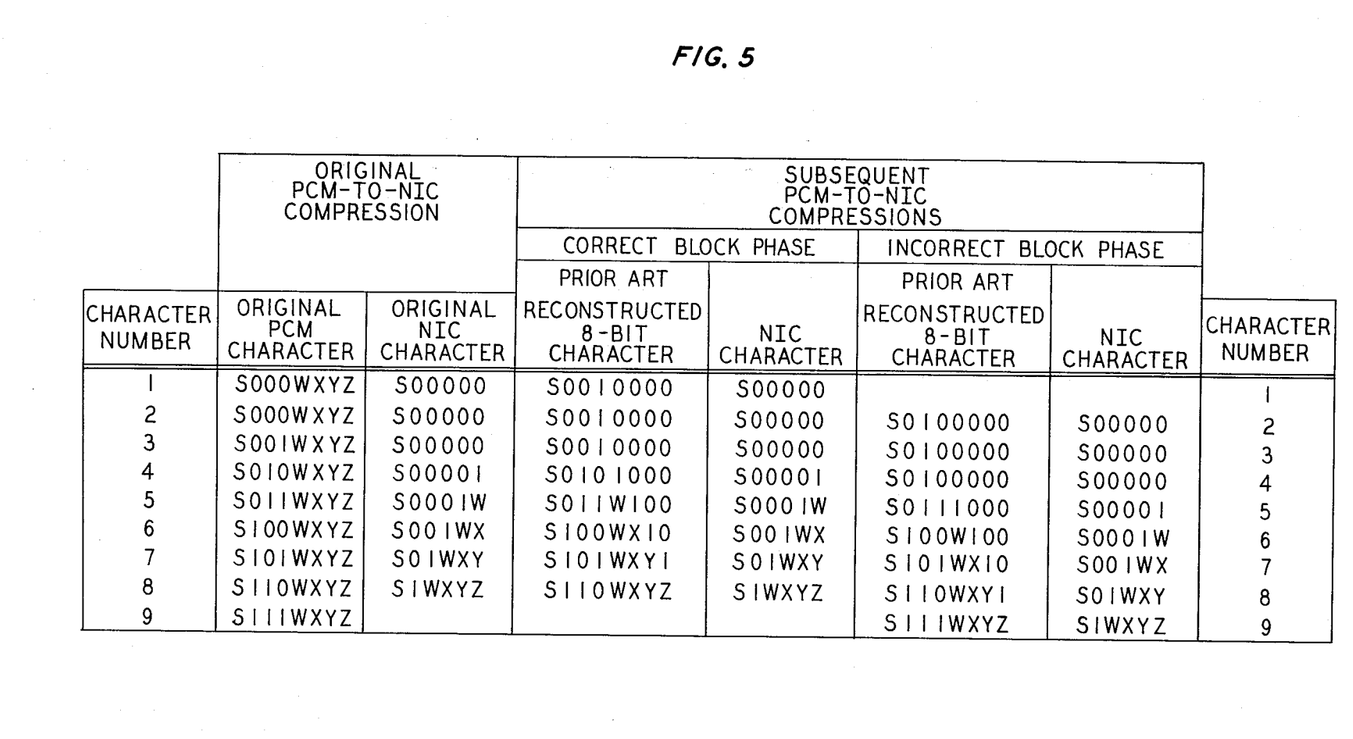
FIG. 5 is a table of digital values useful to explain another aspect of my invention.

Also, as aforementioned, as aggravated signal degradation problem exists in prior art data compression arrangements stemming from the PCM block being subsequently compressed in such a way as to be out-of-phase with its original PCM-to-NIC compression. Illustratively, in accordance with another aspect of my invention, the phase condition of a PCM block can be determined by detecting a predetermined difference between the maximum segment value obtained from the first reconstructed character and the segment value of other characters in the block. A clearer explanation of this aspect of my invention is possible with the aid of FIG. 5. The avoid confusion with the aforedescribed first aspect of my invention, the reconstructed characters used in FIG. 5 to illustrate the second aspect correspond to those prior art characters obtained using column four in FIG. 4. The digital characters in the second column of FIG. 5, labeled "original PCM character," are identified in the first column as character numbers 1 through 9. These characters were judiciously chosen to illustrate the out-of-phase problem solved by my invention. As before, assume a block of eight digital characters. Let the PCM characters numbered 1 through 8 be that block. It is noted that the maximum segment value in the block is 110, located in character number 8. Using the maximum segment value with FIG. 4 for compressing the block, a NIC 6-bit character is obtained for each of the PCM characters. After the maximum segment value has been transmitted, these NIC characters, which appear in the third column labeled "original NIC character," are transmitted to the receiving station. At the receiving station, a NIC-to-PCM expander reconstructs the PCM characters. If the block phase is correct, the prior art reconstructed characters are as shown in column four of FIG. 5. Except for the aforementioned signal degradation caused by the loss of at least one bit in each of those reconstructed characters having a segment value less than the detected maximum, column four is noted to be identical to column two. This identity indicates that the second and subsequent PCM-to-NIC compressions produce no further signal degradation as long as proper phase is maintained between the original and subsequent compressions. However, if an out-of-phase condition exists between the original and the reconstructed blocks, still further signal degradation is obtained. For example, assume that the reconstructed block consists of characters 2 through 9 as shown in column six; while the original PCM block consists of characters 1 through 8 as shown in column two. That is, the PCM block has been advanced one character. It is observed that the maximum segment value of the incorrectly phased reconstructed block is 111. Thus, since subsequent PCM-to-NIC compressions results in the NIC characters shown in colunm seven, it is clear that still further signal degradation is obtained. This is evidenced, for example, by comparing the prior art reconstructed PCM characters in FIG. 5 column four with those in column six. It is toward a solution to this out-of-phase signal degradation problem that the second aspect of my invention is directed.

Now turn to the particulars of the second aspect of my invention for mitigating signal degradation in tandem digital conversions. The improved first reconstructed character of a PCM block contains sufficient information to ascertain the maximum segment value. Subsequent reconstructed characters in the block should not have a segment value in excess of that ascertained from the first reconstructed character. Further, the block should have at least one reconstructed character having the thus ascertained maximum segment value. Upon detection of either such a larger maximum segment value or the absence of a character having the maximum segment value, a violation monitor provides an out-of-phase control signal to a framer. Responsive to the control signal, the block phase is advantageously adjusted by the framer, for example advanced one character at a time, to regain phase with the original PCM-to-NIC compression. The method continues until the detection of the absence of the out-of-phase control signal. Correct block phase is thereafter assumed.

Illustrative apparatus to practice the aforedescribed method for compressing and expanding data in the tandem processing of digital characters is now described. As an aid in perspective, it will be remembered that an analog signal is typically applied through an analog-to-digital encoder to produce a PCM character. The PCM character is then subjected to an original PCM-to-NIC compression. The original compression may be performed using apparatus such as the PCM-to-NIC transmitter digital processor illustrated in FIG. 1 of the aforementioned D. L. Duttweiler et al application. As a result thereof a NIC block may be provided to a NIC-to-PCM expander processor of the type illustrated in FIG. 2 of my drawing. In addition, tandem processing, of course, usually results in a subsequent PCM-to-NIC compression and NIC-to-PCM expansion. Each subsequent PCM-to-NIC compression may be performed using processor apparatus of the type illustrated in my FIG. 1; while each subsequent NIC-to-PCM expansion may be performed using processor apparatus of the type illustrated in my FIG. 2.

Figure 2:
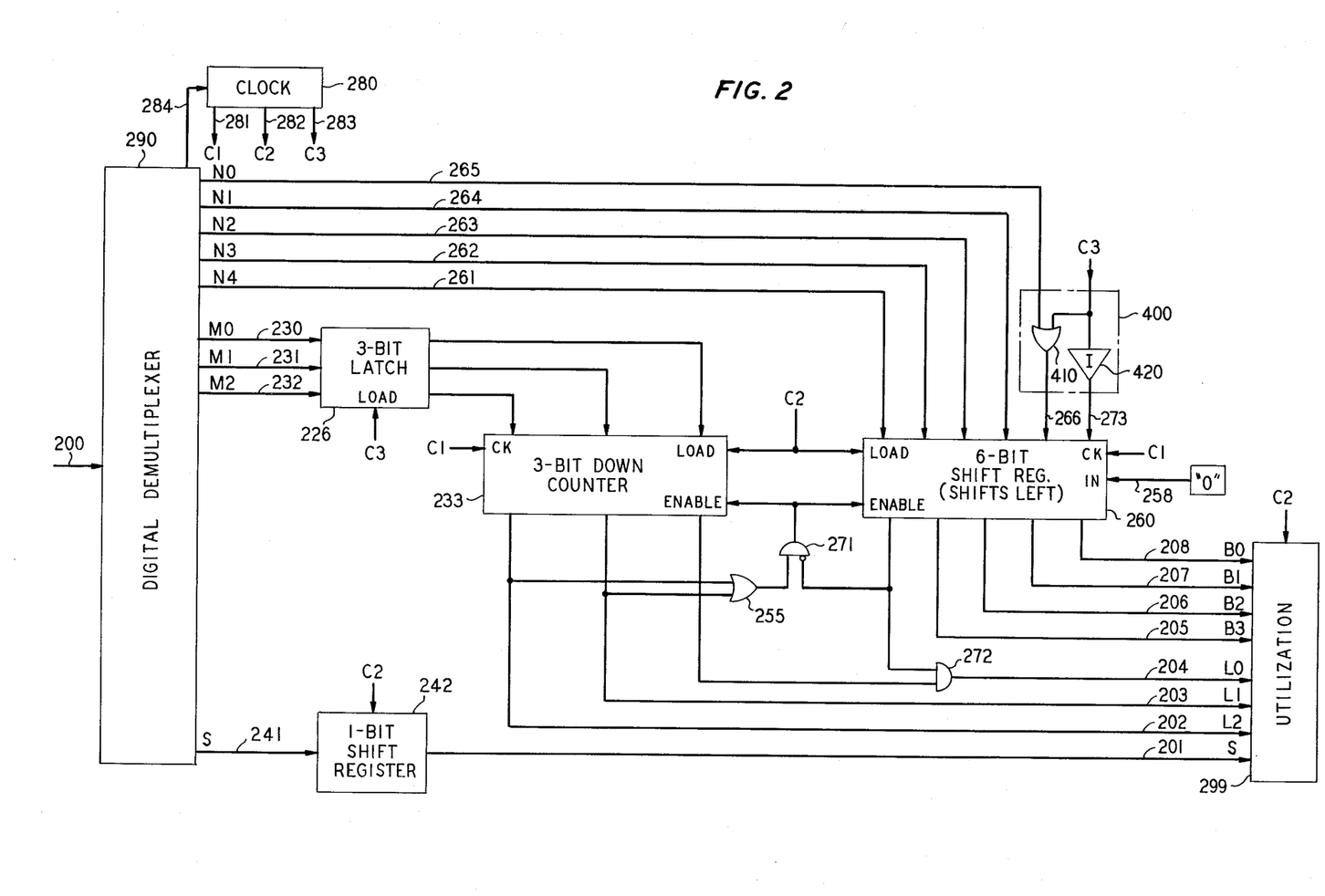
FIG. 2 is a schematic block diagram of an illustrative NIC-to-PCM expander constructed in accordance with the principles of my invention.
Figure 3:
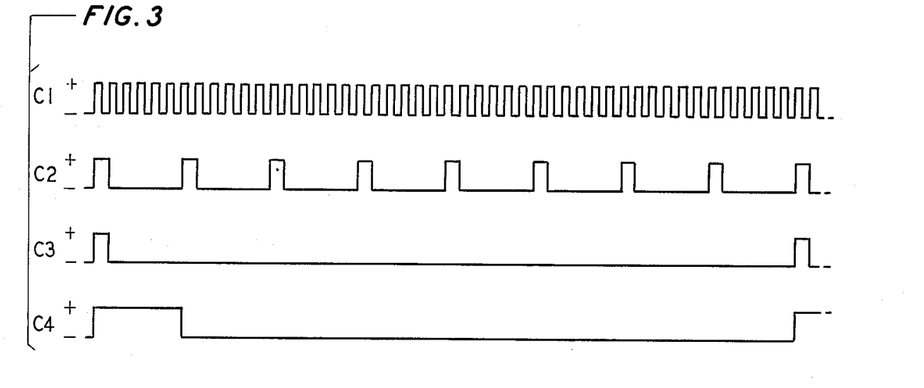
FIG. 3 illustrates a plurality of clock signal waveforms which may be employed within the compressor of FIG. 1 and expander of FIG. 2.

Referring to my FIG. 2, except for apparatus 400, the structure and function performed by the therein illustrated NIC-to-PCM expander is substantially identical to that performed by the receiver digital processor illustrated in FIG. 2 of the D. L. Duttweiler et al application. However, in accordance with one aspect of my invention, apparatus 400 is included to provide the aforementioned improved reconstructed 8-bit character as the first character of the reconstructed PCM block. Specifically, a clock signal having waveform C3 in FIG. 3 is provided by clock 280 over lead 283 jointly to OR gate 410 and inverter 420 of apparatus 400. The relationship among the clock signals is illustrated in FIG. 3 and is hereinafter described. Illustratively, a positive level of the C3 clock signal is assumed to be a logic one and to occur during the first bit of a NIC block; otherwise signal C3 is a logic zero. Responsive to a C3 logic one, the two least-significant bits of 6-bit shift register 260 are loaded respectively over leads 266 and 273, with the logic signal sequence 10. Thereafter, and as described by Duttweiler et al, responsive to an enable signal provided through AND gate 271, shift register 260 is shifted left a predetermined number of bits. Upon each shift a logic zero is entered in the least-significant bit by way of lead 258. The number of bits so shifted corresponds to the number of logic zeros appearing in the NIC 6-bit character between the sign bit and the first high order logic one. This deceptively simple arrangement advantageously results in the improved reconstructed 8-bit character of column five in FIG. 4, which is later inserted by utilization circuit 299 as the first character of the reconstructed PCM block.

Clock signals are employed to drive the apparatus illustrated in my FIGS. 1, 2, 6, and 7. That apparatus usually operates responsive to the position transition of a clock signal applied to a CK input. As to the FIG. 2 expander, demultiplexer 290 drives clock circuit 280 over lead 284 so as to produce waveforms C1, C2 and C3 respectively on leads 281, 282 and 283. As to the FIG. 1 compressor, clock circuit 180 drives multiplexer 190 over lead 184. Clock 180 also produces waveforms C1 and C2 respectively on leads 181 and 182; while frame circuit 700, responsive to signals C1 and C2, provides clock signals C3 and C4, respectively on leads 701 and 702. The compressor and expander waveforms are illustrated in FIG. 3 using well-known notational form. An essentially square waveform is provided on leads 181 and 281 at an output of clock circuits 180 and 280, respectively, and is designated in FIGS. 1, 2, 3, 6 and 7 as C1. Within clocks 180 and 280, waveform C1 is counted down by six, i.e. the number of bits in a fewer-bit character, to provide a rectangular waveform on leads 182 and 282, respectively, of the type illustrated as waveform C2 in FIG. 3. In addition, clock 180 and framer 700, the latter shown in FIG. 7, further count waveform C2 by eight, i.e. the number of characters in a block, in order to provide on leads 183 and 701 a rectangular waveform of the type illustrated as waveform C3 in FIG. 3. Still further, framer 700, in response to waveforms C1, C2 and C3, provides a signal on lead 702 of the type illustrated as waveform C4 in FIG. 3.

Figure 1:
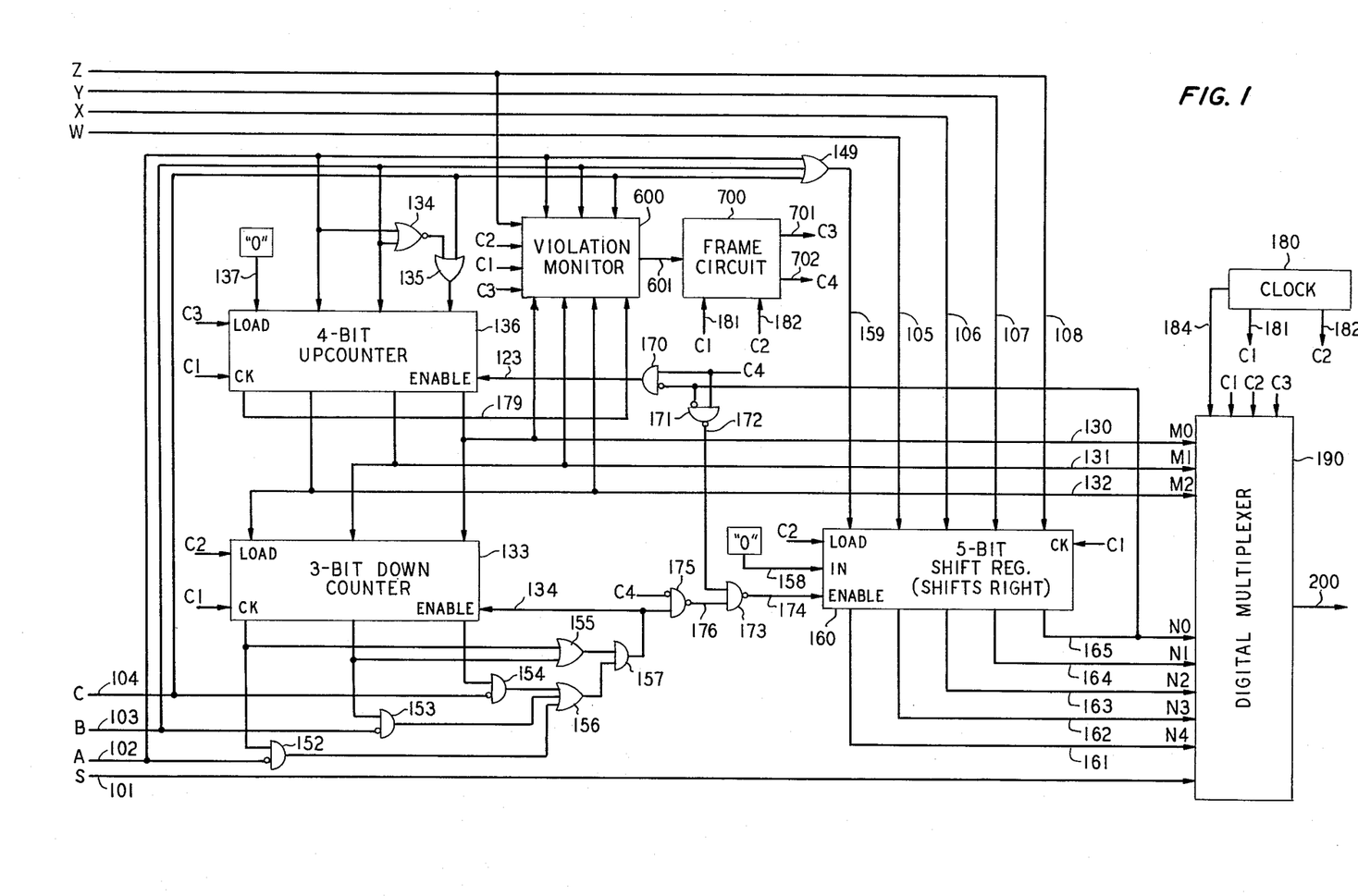
FIG. 1 is a schematic block diagram of an illustrative PCM-to-NIC compressor constructed in accordance with the principles of my invention.

Now referring to my FIG. 1, the structure and function performed by the therein illustrated PCM-to-NIC compressor relates to an improvement over the FIG. 1 transmitter digital processor of the D. L. Duttweiler et al application. Specifically removed from the prior art compressor is the aforementioned digital delay apparatus which, in part, results in the prior art signal delay accumulation problem. The improved compressor may be employed at each subsequent compression point in the tandem chain to advantageously detect the maximum segment value via the first reconstructed character in the reconstructed PCM block. Broadly, each reconstructed 8-bit character is presented in parallel form on input lines 101 through 108. The sign bit, represented by the letter S, is presented on line 101 and extended directly to digital multiplexer 190. The three bits corresponding to the segment value are represented by the letters A, B and C and are presented on input lines 102, 103 and 104, respectively. The three segment bits are then coupled jointly to AND gates 152, 153 and 154, respectively, as well as to 4-bit upcounter 136, violation monitor 600 and OR gate 149. Finally, the four mantissa bits, represented by the letters W, X, Y and Z, are presented on input lines 105 through 108, respectively, and extended directly to shift register 160.

Firstly, consider the first reconstructed character of the block. If any of the segment bits appearing on leads 102, 103 or 104 is a logic one, then responsive thereto, a logic one is extended through OR gate 149 over lead 159 to the high order bit of shift register 160; otherwise a logic zero is so extended. Unless register 160 is shifted, as later described, that high order bit becomes the second bit of the NIC character. Next, since the compressed character is related to the maximum segment value, that value need be determined. Fortunately, in accordance with the principles of my invention, that value can be also determined from the first reconstructed character. That is, the maximum segment value equals the segment value of the first reconstructed character, appearing on leads 102, 103 and 104 (except if that value is 000, in which case OR gates 134 and 135 convert the segment value to 001), plus the number of logic zeros preceding the first least significant logic one, if any, in the mantissa bits appearing on leads 105 through 108. Specifically, responsive to a C3 logic one, upcounter 136 is loaded; similarly responsive to a C2 logic one, shift register 160 is loaded. Next, the upcounter and shift register are advantageously enabled so as to determine the number of logic zeros preceding the first least significant logic one in the mantissa bits. As to the enabling, waveform C4 is applied to respective first inputs of AND gates 170 and 171. Thereby, a logic one is applied to the respective AND gate first input during the whole of the first reconstructed character of the block. The least significant bit output of shift register 160 is jointly connected over lead 165 to respective inverting second inputs of AND gates 170 and 171. As previously mentioned, the least-significant mantissa bit of the NIC 6-bit character arising from an improved reconstructed 8-bit character is always a logic one. To so provide that least-significant logic one, shift register 160 is advantageously shifted right until the logic one, provided on one of leads 159 or 105 through 108, appears on lead 165, and hence appears at the respective second inputs of AND gates 170 and 171. Until the logic one is so detected on lead 165, AND gates 170 and 171 extend an enable signal respectively over lead 123 to upcounter 136 30 and over lead 172 through NAND gate 173 over lead 174 to shift register 160. Responsive to each positive transition of waveform C1 provided to respective CK inputs, upcounter 136 is incremented and shift register 160 shifts right, stuffing a logic zero over lead 158 in the high order bit, until detection on lead 165 of the logic one. Thereafter, upcounter 136 is disabled and contains therein the maximum segment value, except if the maximum value is 000 in which case upcounter 136 contains 001. The therein contained maximum segment value is then extended over leads 130, 131 and 132 jointly to 3-bit down counter 133, which is described in the prior art, violation monitor 600 for detecting an out-of-phase condition, and multiplexer 190 for transmission to the receiving station. The NIC 6-bit character is extended over leads 101 and 161 through 165 to multiplexer 190 also for transmission to the receiving station. As an aside upcounter 136 is illustratively a 4-bit counter with a logic zero extended over lead 137 to its most significant bit position. In response to an overflow counter error, an overflow signal is extended to violation monitor 600 over lead 179 so as to stimulate the provision of an out-of-phase signal to frame circuit 700.

Secondly, consider the reconstructed characters in the block subsequent to the first. As with the first reconstructed character, the segment bits are extended through OR gate 149, lead 159 and thence into the high order bit of shift register 160; while the mantissa bits are extended over leads 105 through 108 also to shift register 160. These five bits are thereafter loaded into register 160 in response to a logic one in waveform C2. It is noted that since waveforms C3 and C4 remain a logic zero for the subsequent characters of the block, upcounter 136 is not reloaded and remains disabled. Also, the segment bits of each subsequent character are monitored by violation monitor 600 and there compared with the maximum segment value to provide, if necessary, an out-of-phase control signal over lead 601 to frame circuit 700.

Figure 6:
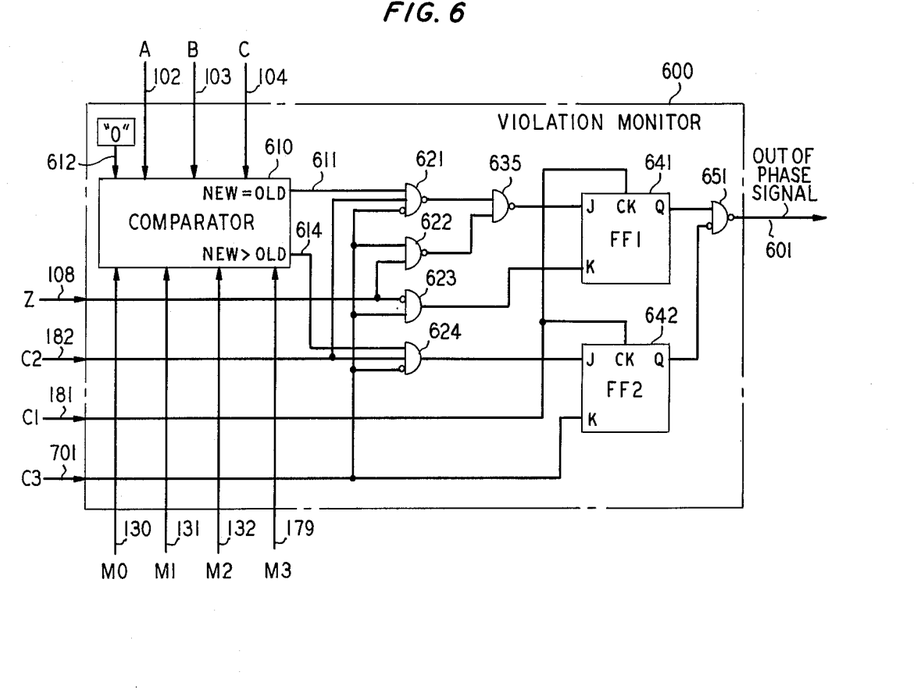
FIG. 6 illustrates a violation monitor which may be employed in the PCM-to-NIC compressor of FIG. 1.
Figure 7:
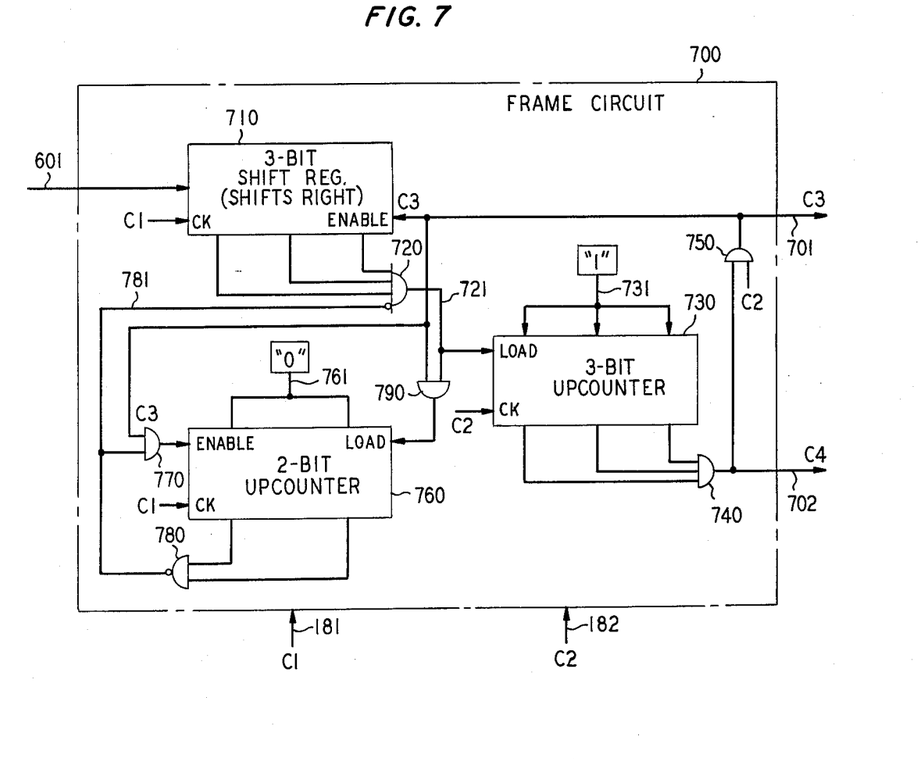
FIG. 7 illustrates a framing circuit which may be employed in the PCM-to-NIC compressor of FIG. 1.

An illustrative embodiment of violation monitor 600 is shown in schematic form in FIG. 6. Broadly, the illustrative monitor provides an out-of-phase signal in either of two events, i.e. if either no reconstructed character in the block has a segment value equal to the maximum segment value or at least one character in the block has a segment value larger than the maximum segment value. The detection of the first event is stored in flip-flop 641; while that of the second event is stored in flip-flop 642.

Specifically, yet illustratively, the maximum segment value is extended over leads 130, 131, 132 and 179 to comparator 610. The segment value of the PCM character being compressed is extended on leads 102, 103 and 104, with a logic zero being forced in the high order bit by way of lead 612. On the other hand, if the new segment value, meaning the value appearing on leads 102 through 104, equals the old segment value, meaning the maximum segment value, comparator 610 provides an equality signal, here, a logic one on lead 611; otherwise a logic zero is so provided on lead 611. Lead 611 is extended through a first input of NAND gate 621, thence through a first input of NAND gate 635, to a J input of flip-flop 641. On the other hand, if the new segment value exceeds the old segment value, an exceeding signal, here a logic one, is provided to lead 614; otherwise, a logic zero is provided on lead 614. Lead 614 is extended through a first input of AND gate 624 to a J input of flip-flop 642. Clock signal C2 is extended over lead 182 jointly to respective second inputs of NAND gate 621 and AND gate 624. Clock signal C3 is extended over lead 701 to respective inverted third inputs of NAND gate 621 and AND gate 624 as well as to respective first inputs of NAND gate 622 and AND gate 623 and to the K input of flip-flop 642. Also, the least-significant mantissa bit, here labeled Z, is extended over lead 108 to respective second inputs of gates 622 and 623, the latter input being inverted. An output of NAND gate 622 is extended to a second input of NAND gate 635; an output of AND gate 623, to the K input of flip-flop 641. The Q output of flip-flops 641 and 642 are extended as respective first and second, the later being inverted, inputs of NAND gate 651. An output of gate 651 is provided on lead 601 as the out-of-phase signal where, illustratively, a logic one represents out-of-phase and logic zero represents not out-of-phase. While the signal on lead 601 is extended to frame circuit 700, as later described, frame circuit 700 is not enabled until the next logic one in waveform C3, i.e. at the first character of the next block.

Operationally consider the first event for providing an out-of-phase signal, i.e. no character in the block has a segment value equal to the maximum segment value. As observable from column five of FIG. 4, the segment value of the first character in a block equals the maximum segment value if and only if the Z mantissa bit signal on lead 108 is a logic one. Also, during the first character and as shown in FIG. 3, clock signal C3 is a logic one. Accordingly, a logic zero is extended from the output of NAND gate 622 to an input of NAND gate 635 and thence a logic one is extended to a J input of flip-flop 641, thereby setting flip-flop 641. Remember, flip-flop 641 is set whenever at least one character in the block has a segment value equal to the maximum segment value and here that character is the first character of the block. To reset flip-flop 641 a logic one signal is extended from AND 623 to the K input of 641. However, since the first input to AND 623 is waveform C3 and since waveform C3 is a logic zero for other than the first character of the block, flip-flop 641 is not reset during a block after being set in the block. If that character which has its segment value equal to the maximum segment value is other than the first character, then Z bit of the first character is a logic zero and hence through the inverting second input of AND gate 623, flip-flop 641 is reset to temporarily appear out-of-phase. After the first character, clock signal C3 is a logic zero while clock signal C2 is a logic one. Hence, an equality signal provided on lead 611 is extended through NAND gate 621 as a logic zero, and hence through logic gate 635 as a logic one, thereby setting flip-flop 641. Absent an equality signal, flip-flop 641 remains reset and hence at the start of the next block, i.e. at the next logic one in waveform C3, and responsive to a thus provided out-of-phase signal, frame circuit 700 adjusts the block phase. Absent an exceeding signal on lead 614, it is noted that flip-flop 642 is reset. That is, the Q output of 642 is forced to a logic zero in response to the first character of the block, i.e. in response to clock signal C3 being a logic one. Hence, the second input to NAND gate 641, being inverted, is a logic one and remains so until flip-flop 642 is set in response to a new value exceeding an old value.

Now consider the second event for providing an out-of-phase signal, i.e. at least one character in the block has a segment value larger than the maximum segment value. Of course, it is clear that the segment value of the first character of the block is never larger than the maximum segment value of the block. Hence, the logic signal at the first character which is extended over lead 614 through AND gate 624 is a logic zero. Thus, as aforementioned, flip-flop 642 remains reset. During the subsequent characters in the block, logic signal C3, provided to the K input of flip-flop 642 and to the inverting third input of AND gate 624, is a logic zero; while waveform C2 is a logic one. Accordingly, in response to an exceeding signal extended from comparator 610 over lead 614, indicating the new segment value to exceed the old segment value, a logic one is extended through AND gate 624 to set flip-flop 642. The output of 642 is thereafter inverted at the second input to NAND gate 651 resulting in an out-of-phase signal being provided over lead 601.

Various out-of-phase strategies may be employed responsive to the out-of-phase signal. For example, frame circuit 700, an illustrative embodiment of which is shown in schematic form in FIG. 7, may employ shift register 710 to detect the occurrence of three consecutive blocks being out-of-phase before adjusting block phase. There, a logic one appearing on lead 601 is right shifted into register 710 in response to an enable signal corresponding to a logic one in waveform C3. The outputs of register 710 are extended through AND gate 720 jointly to a load input of 3-bit upcounter 730 and a first input of AND gate 790. In response to the detection of three consecutive blocks being out-of-phase, the logic sequence 111 is extended over lead 731 through upcounter 730 to respective inputs of AND gate 740. In response thereto, waveform C4 is extended from an output of AND gate 740 jointly to lead 702 and to a first input of AND gate 750, the latter gate for providing waveform C3 to lead 701 upon concurrent detection of waveforms C2 and C4 at its second and first inputs. Thereby, waveforms C3 and C4 are advanced to occur at the very next character for once again detecting an out-of-phase condition, i.e. the block phase is advanced one character. In response to the coincidence of the aforementioned logic one output from AND gate 720 and a logic one of waveform C3, extended internally over lead 701 to a second input of AND gate 790, the logic sequence 00 is inserted in upcounter 760 over lead 761. The respective outputs of upcounter 760 are extended through NAND gate 780 jointly to a first input of AND gate 770 and over lead 781 to a fourth (inverted) input of AND gate 720. Upcounter 760 is utilized within frame circuit 700 to disable the frame adjustment for three blocks in order to advantageously clear shift register 710. The disabling occurs in that, after the logic sequence 00 has been loaded in upcounter 760, the output of NAND gate 780 becomes a logic one. That output is extended over lead 781 and inverted at an input of AND gate 720, an output of which is therefore a logic zero. The logic one output of NAND gate 780 in coincidence with waveform C3 being a logic one at a second input of AND gate 770 advantageously enables upcounter 760 at each C3 pulse. Hence, the phase shift output of AND gate 720 is delayed until upcounter 760 provides at its output and, hence at the inputs to NAND gate 780, the binary sequence 11.

Although the invention has been described and illustrated in detail, it is to be understood that the same is by way of illustration and example only, and is not to be taken by way of limitation. Rather the spirit and scope of my invention is limited only by the terms of the appended claims.

What I claim is:

1. In a digital communication system, apparatus for processing a first block of digital characters, each character in said first block having segment bits and mantissa bits, said segment bits corresponding to a value, said processor apparatus including means responsive to a maximum segment value for developing a second block of digital characters, each character in said second block having at least one fewer bit than a corresponding character in said first block and CHARACTERIZED IN THAT said processor apparatus further comprises:
   means responsive to a predetermined character in said first block for determining said maximum segment value, said maximum value being equal to the additive sum of the value of a first function of said segment bits of said predetermined character plus the value of a second function of a predetermined bit pattern in said mantissa bits of said predetermined character whereby each character in said second block is developable in response to a difference between said maximum segment value and a value of the segment bits of a character in said first block 2. The apparatus defined in claim 1:
   wherein said second function comprises:
   means for determining the number of mantissa bits of said predetermined bit pattern corresponding to a first logic state.

3. The apparatus defined in claim 1 further comprising:
   means for adjusting block phase, said adjusting means including
   means for comparing said maximum segment value with said value of said segment bits of each character in said first block.

4. The apparatus defined in claim 3 wherein said adjusting means further comprises:
   means responsive to said comparing means for determining that no character in said first block includes segment bits having a value larger than said maximum segment value.

5. The apparatus defined in claim 4 wherein said adjusting means further comprises:
   means responsive to said comparing means for determining that at last one character in said first block includes segment bits having a value equal to said maximum segment value.

6. The apparatus defined in claim 3 wherein said adjusting means further comprises:
   means responsive to said comparing means for determining that at least one character in said first block includes segment bits having a value equal to said maximum segment value.

7. In a digital communication system, apparatus for processing a first block of digital characters, each character in said first block having segment bits and mantissa bits, said segment bits corresponding to a value, said processor including means for developing a second block of digital characters, each character in said second block having at least one fewer bit than a corresponding character in said first block and CHARACTERIZED IN THAT said processor further comprises:
   means responsive to a predetermined character in said first block for determining a maximum segment value, said maximum value determining means being responsive to a predetermined function of said segment bits of said predetermined character and responsive to a predetermined bit pattern in said mantissa bits of said predetermined character.
   means for determining the number of mantissa bits of said predetermined bit pattern corresponding to a first logic state, and
   wherein said predetermined function corresponds to the sum of said value of said segment bits of said predetermined character and of said number of bits corresponding to said first logic state.

8. In a digital communication system, apparatus for processing a first block of digital characters, there being a maximum segment value associated with said first block, said processor including means for developing a second block of digital characters; each character in said second block having segment bits and mantissa bits and having at least one more bit than a corresponding character in said first block; said segment bits having a value, and CHARACTERIZED IN THAT said processor further comprises:
   means responsive to said maximum segment value for constructing a predetermined character in said second block, said predetermined character having segment bits corresponding to a first predetermined function of said maximum segment value and said corresponding character, and said predetermined character having mantissa bits including a predetermined bit pattern corresponding to a second predetermined function of said maximum segment value and said segment bits of said predetermined character, said predetermined bit pattern includes a bit corresponding to a first logic state to which may be appended at least one bit corresponding to a second logic state, the number of said second logic state bits so appended corresponding to said second function.

9. The apparatus defined in claim 8 wherein said number of appended second logic state bits corresponds to a difference between said maximum segment value and said value of said segment bits of said predetermined character.

10. The apparatus defined in claim 8 wherein said first predetermined function corresponds to a difference between said maximum segment value and said number of appended second logic state bits.

11. In a compressor for use in a digital communications system, a machine method for compressing a first block of digital characters, each character in said first block having segment bits to identify an amplitude range and mantissa bits to identify an interval in said range, said method comprising the steps of:

determining the maximum segment value in said first block from the additive sum of the values of a first function of the segment bits and a second function of the bit pattern of the mantissa bits of a predetermined character in said first block,     storing said maximum segment value,     transmitting said maximum segment value,     processing each digital character in said first block in response to a difference between the value of its segment bits and said stored maximum segment value to form a second block of digital characters, each character in said second block having fewer bits than a corresponding character in said first block, and     transmitting each digital character in said second block responsive to said predetermined character without waiting until all characters in said first block have been so processed to form said second block.

12. The machine method for compressing digital characters as defined in claim 11 further comprising the steps of:

ascertaining a value of said segment bits of each character in said first block,     comparing said ascertained segment value with said maximum segment value,     providing a control signal in response to a predetermined relationship between said maximum and said ascertained values, and     adjusting a block phase between said first and said second blocks in response to said control signal.

* * * * *